(12) United States Patent
Venkataraman et al.

(10) Patent No.: US 8,847,578 B2
(45) Date of Patent: Sep. 30, 2014

(54) AMBIENT NOISE CANCELLATION IN PULSED INPUT SYSTEM

(75) Inventors: Jagannathan Venkataraman, Bangalore (IN); Sandeep Kesrimal Oswal, Bangalore (IN); Vinod Srinivasan Paliakara, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 237 days.

(21) Appl. No.: 13/553,810

(22) Filed: Jul. 19, 2012

(65) Prior Publication Data
US 2013/0021018 A1 Jan. 24, 2013

Related U.S. Application Data

(60) Provisional application No. 61/509,678, filed on Jul. 20, 2011.

(51) Int. Cl.
*G01R 1/30* (2006.01)
*H03M 3/00* (2006.01)
*H03M 1/12* (2006.01)
*G01R 19/25* (2006.01)

(52) U.S. Cl.
CPC ............ *H03M 1/1295* (2013.01); *H03M 3/494* (2013.01); *G01R 19/2506* (2013.01)

USPC ......... 324/123 R; 341/143; 341/155; 600/310

(58) Field of Classification Search
CPC .......... G01K 3/00; H03M 1/10; H03M 3/494; H03M 1/1295; H03M 1/12; H03M 3/02; G01R 19/2506; G01R 29/00
USPC ................................ 324/12 R; 341/155, 143
See application file for complete search history.

(56) References Cited

U.S. PATENT DOCUMENTS

2010/0222655 A1* 9/2010 Starr et al. .................... 600/310

OTHER PUBLICATIONS

"Pulse oximetry", Wikipedia, pp. 1-6, available at http://en.wikipedia.org/wiki/Pulse_oximetry on Jun. 27, 2012.

* cited by examiner

*Primary Examiner* — Arleen M Vazquez
*Assistant Examiner* — Son Le
(74) *Attorney, Agent, or Firm* — Alan A. R. Cooper; Frederick J. Telecky, Jr.

(57) ABSTRACT

Embodiments of the invention provide a pulseoximetry system with ambient offset cancellation that subtracts an estimated ambient offset to thereby allow a large front end gain while operating the front end on a low supply voltage. This large gain reduces input referred noise of an analog to digital converter in the front end while providing high dynamic range for signals with a large ambient offset.

15 Claims, 4 Drawing Sheets

US 8,847,578 B2

AMBIENT NOISE CANCELLATION IN PULSED INPUT SYSTEM

CLAIM OF PRIORITY UNDER 35 U.S.C.(e)

The present application claims priority to and incorporates by reference U.S. Provisional Application No. 61/509,678 filed Jul. 20, 2011, entitled "Low Noise Ambient Cancellation Scheme In Pulsoximetry Frontend".

FIELD OF THE INVENTION

Embodiments of the invention are directed, in general, to electronic systems and, more specifically, to a low noise, low power front end for a pulsed input system and methods using same.

BACKGROUND OF THE INVENTION

Pulse-oximetry is a non-invasive method that may be used to monitor the saturation of a patient's hemoglobin. Pulse-oximetry typically utilizes a pair of small light-emitting diodes (LEDs) facing a photodiode through a translucent part of the patient's body, usually a fingertip or an earlobe. One LED is red, with wavelength of 660 nm, and the other is infrared, 905, 910, or 940 nm. Absorption at these wavelengths differs significantly between oxyhemoglobin and its deoxygenated form; therefore, the oxy/deoxyhemoglobin ratio can be calculated from the ratio of the absorption of the red and infrared light. The monitored signal bounces in time with the heart beat because the arterial blood vessels expand and contract with each heartbeat. By examining only the varying part of the absorption spectrum (essentially, subtracting minimum absorption from peak absorption), a monitor can ignore other tissues or nail polish, and discern only the absorption caused by arterial blood.

In measurements systems such as for pulse-oximetry, the desired signal has a very small amplitude that rides on a large ambient offset signal. In pulsed input measurement systems, such as for oximetry, the front end transimpedance amplifiers or gain amplifiers need to have a large bandwidth in order to support the pulsing input signals. The equivalent noise bandwidth of the front end is larger because of the large bandwidth for settling, even though the signal bandwidth of interest is much smaller. The front end gain is usually restricted to avoid saturation of the front end due to the large offset signal in comparison to the signal of interest. Since the front end needs to support large signal swings because of the offset, it is typically operated on a higher supply voltage which increases power consumption.

BRIEF DESCRIPTION OF THE DRAWINGS

Particular embodiments in accordance with the invention will now be described, by way of example only, and with reference to the accompanying drawings.

Figure 1:
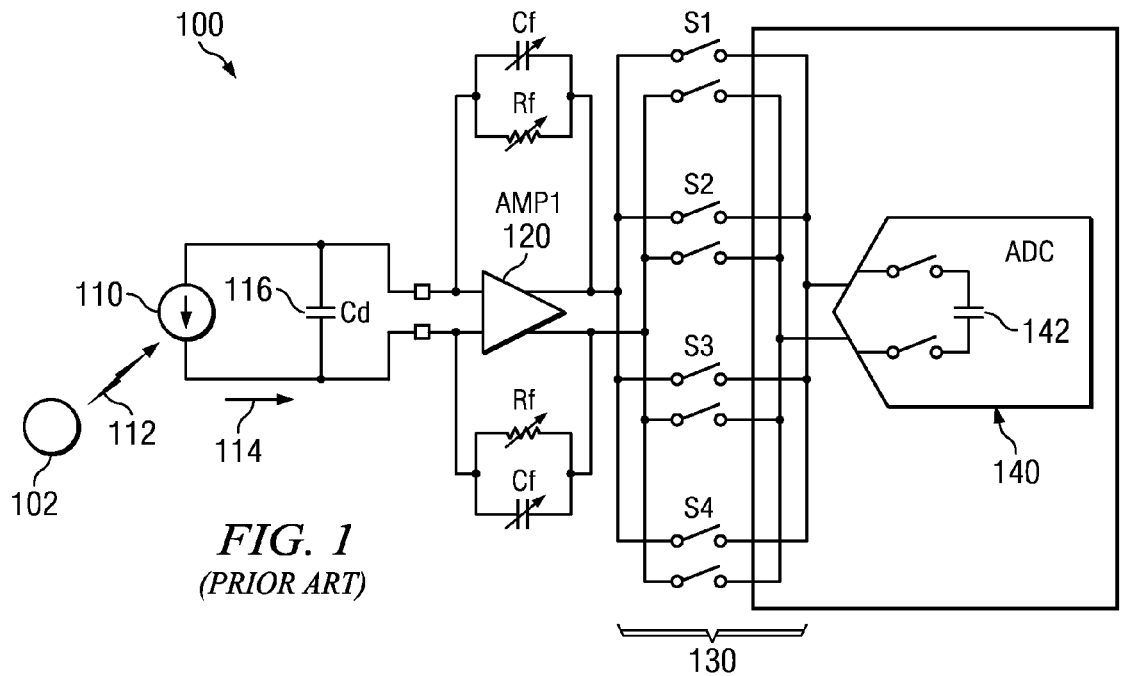
FIG. 1 is a schematic of a prior art pulsed input system.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Certain measurement systems and medical systems, such as pulseoximetry, have pulsed input signals with low duty cycles. The input signal of interest may be at a low frequency and is carried on the pulsed, low duty cycle input signal. For example, in a test instrument there may be a photodiode that is illuminated by an LED (light emitting diode) at a predefined pulse recurrence frequency (PRF) of 1 kHz with duty cycles of 5%. In such a system, the signal of interest typically has very low signal amplitude riding on large ambient offset signals. The LED's are pulsed with low duty cycle and the photodiode measures the intensity of LED light that passes through the blood. The ambient phase where the LED is off still generates a large photodiode current because of the environment ambient light. The desired signal of interest through the blood is very small compared to this ambient offset signal. For example, the signal of interest may be 100 nA whereas the ambient offset may be 1 uA. In the presence of large ambient offset, detection of the signal of interest is difficult because sufficient amplification of the input signal may saturate the signal chain.

Embodiments of the invention include an ambient offset cancellation scheme that involves using an offset digital to analog converter (DAC) to subtract an estimation of the ambient offset at the front end prior to amplifying the input signal.

FIG. 1 is a schematic of a prior art pulsed input system 100. Detector 110 receives pulses of light or infrared from one or more light emitting diodes or other transmitter device 102 and generates current pulses 114 in response to the received pulses 112. Transimpedance amplifier 120 receives the current pulses and converts current to voltage. The output signal is measured as a voltage. Because the output is a voltage and the input is a current, the gain, or ratio of output to input, is expressed in of ohms.

Short duration current pulses 114 are amplified using transimpedance amplifier 120 and then digitized by ADC 140 to achieve a high dynamic range in the range of 100 dB. Transimpedance amplifier 120 feeds a switched capacitor sigma delta ADC 140. In other examples, ADC 140 may be a successive-approximation register (SAR) converter. Transimpedance amplifier 120 needs to charge the ADC sampling capacitor 142 during short time periods defined by S1, S2, S3, S4 using switching array 130. Typically, in order to achieve a dynamic range of sixteen bits, capacitor 142 is a large capacitor. Typically, switched capacitor sigma delta converters of 16-18b resolution present capacitors that need to be switched at high oversampling rates. This increases the bandwidth specification and power consumption of transimpedance amplifier 120.

The transimpedance amplifier bandwidth is set by the S1/S2/S3/S4 sampling periods. Thus, for large Cd's 116 the TAoutput noise sees a gain of Cd/cf and is integrated by the TA bandwidth that is set by the pulse time S1/S2/S3/S4. For example, for PRF=1 KHz, 5% duty cycle S1/S2/S3/S4=50 uS. TA BW for 10 tau settlingBW is 35 kHz. The bandwidth is selected to provide approximately ten time-constants of settling within the pulse time. Tau is the time constant in sec. So, noise is integrated in this entire bandwidth in FIG. 1 where it feeds the switched capacitor ADC 140.

A continuous time sigma delta (CTSD) converter that has inherent antialiasing and also presents a resistive load may be used for ADC 140. This reduces the power needed from transimpedance amplifier 120. However, a CTSD converter needs to run at a high conversion rate determined by pulses S1, S2, S3, S4. Since the pulse time is defined by S1, S2, S3, S4, the signal is available to the ADC during this time. Therefore, the ADC has to do each conversion within the S1/S2/S3/S4 times while the TA is directly hooked to the ADC and thus the ADC conversion rate needs to be higher. The general operation of a CTSD converter is well known. Much like the discrete-time sigma-delta converters found in many high-precision applications, the continuous-time sigma-delta architecture incorporates oversampling and noise shaping to achieve high resolution.

Figure 2:
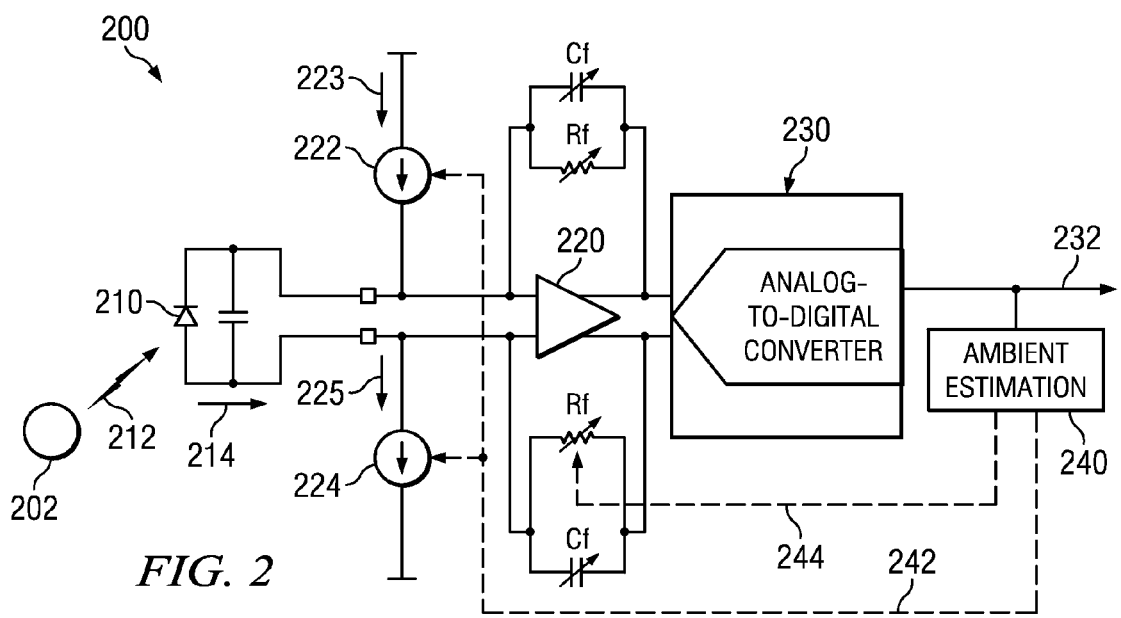
FIGS. 2 and 3 are schematics of a pulsed input signal processor with reduced ambient noise.

FIG. 2 is a schematic of a pulsed input signal processor 200 with reduced ambient noise. As discussed above, certain measurement systems and medical systems such as pulse oximetry have very low signal amplitudes riding on large ambient offset signals. The LED's 202 are pulsed at a low duty cycle and the photodiode 210 measures the intensity of LED light 212 that passes through the blood. During the ambient phase where the LED is off, a large photodiode current 214 may still be generated because of environment ambient light. The desired signal of interest through the blood is very small compared to this ambient offset signal. For example, a desired signal may be 100 nA whereas the ambient offset may be 1 uA.

In this embodiment, a significant portion of the ambient offset signal is cancelled at the frontend and the resultant signal is then amplified up to meet a high dynamic range. An ambient offset value is estimated by estimator 240 and ambient offset DACs 222 and 224 are set to subtract a representation of the ambient offset at the input in response to control signal 242.

Input current signal 214 includes ambient light signal I(amb) and light signal of interest I(sig). Offset current DACs 222, 224 are controlled to produce an offset current I(offsetdac) 223 and 225 that is approximately equal to I(amb) and thereby subtracts the I(amb) offset current from input current signal 214.

Feedback resistors Rf are then adjusted by control function 244 to have a value to produce a gain in amplifier 220 of approximately the full scale swing (VFS) of analog to digital converter (ADC) 220 divided by an average expected value of I(sig). Input referred current noise of ADC 220 is approximately equal to $Vn_{ADC}/Rf$, where $Vn_{ADC}$ is the noise produced by ADC 220.

Ambient estimation module 240 may measure an output sample 232 produced by ADC 230 during a period of time when transmitter 202 is turned off and which therefore corresponds to ambient current I(amb). Ambient estimation module 240 may then produce a control signal 242 that controls offset current DACs 222, 224. By periodically monitoring the output of ADC 230 during ambient time periods and adjusting control signal 242 in a feedback manner, the effect of I(amb) may be significantly reduced.

However, it should be noted that offset DACs 222 and 224 need to operate at a very low level of current noise, which is difficult to meet.

Figure 3:
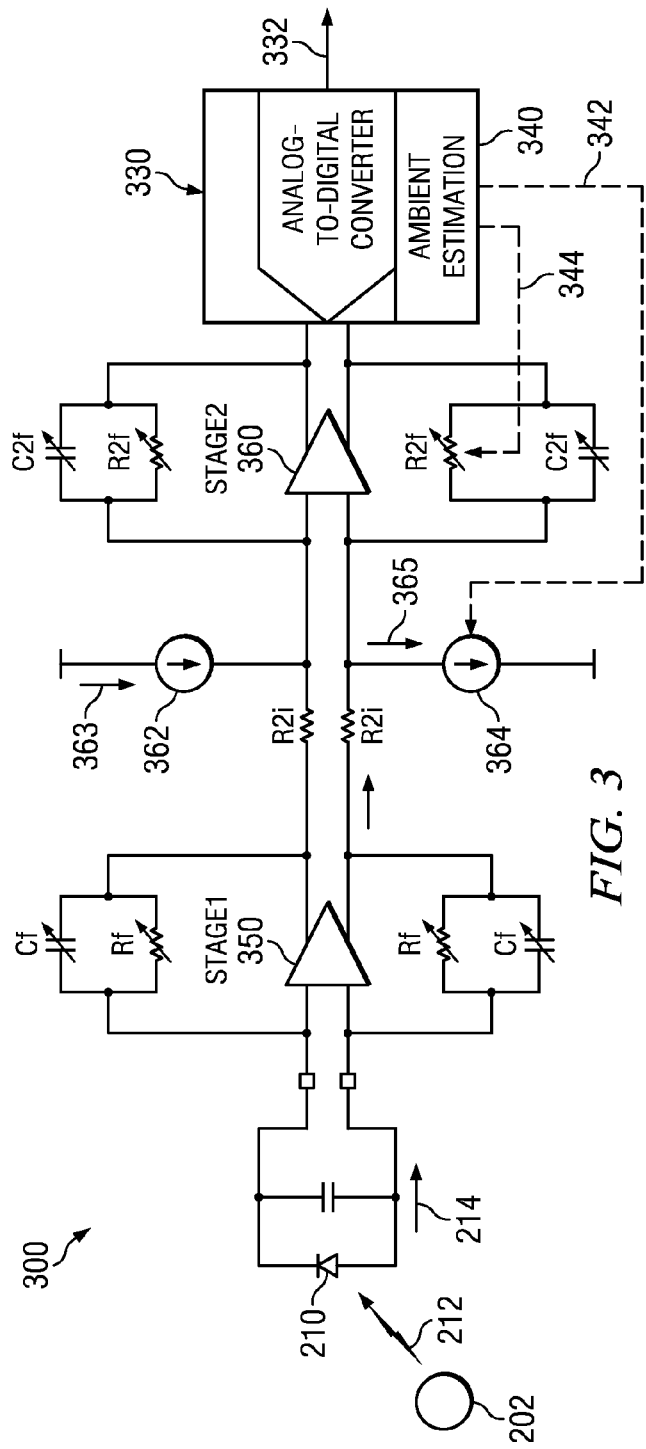

FIG. 3 is a schematic of another embodiment of a pulsed input signal processor 300 with reduced ambient noise. In this embodiment, the front end is split into two stages: a preamplifier stage1 350, and a stage2 360. The transimpedance gain of preamplifier stage 350 is chosen such that the input signal with ambient light offset occupies approximately the full scale range at the first stage output. Preamplifier transimpedance stage 350 is fed into a second voltage gain stage 360. Ambient offset correction current provided by DAC 362, 364 is subtracted at the input of second stage 360 in order to correct for the input offset. While the offset correction DAC 362, 364 needs to operate at a low noise level, the noise level may be relaxed as compared to offset correction DAC 222, 224 of FIG. 2.

As described earlier, ambient estimation module 340 may measure an output signal produced by ADC 330 during a period of time when transmitter 202 is turned off and which therefore corresponds to ambient current I(amb). Ambient estimation module 340 may then produce a control signal 342 that controls offset current DACs 362, 364. By periodically monitoring the output of ADC 330 during ambient time periods and adjusting control signal 342 in a feedback manner, the effect of I(amb) may be significantly reduced by offset adjustment current 363, 365.

Depending on the ambient offset signal, offset DAC 362, 364 may be adjusted to cancel the input offset and then the second stage gain may be increased to reach full scale of ADC 330. The gain of second stage 360 may be adjusted by controlling feedback resistors R2f in response to control function 342.

Thus, the ADC input referred noise sees a large attenuation because of the combination of stage1 and stage2 gains meeting high dynamic range. Also, the offset correction DAC 362, 364 is at the stage1 350 output so the noise of offset correction DAC 362, 364 sees attenuation of stage1 gain. Overall, this helps meeting a high dynamic range even with large ambient offset signals.

Input signal 214 includes ambient light signal I(amb) and light signal of interest I(sig). Feedback resistors Rf are adjusted to have a value to produce a gain in amplifier 350 of approximately the full scale swing (VFS) of stage1 350 divided by an average expected value of I(sig) plus I(amb). Offset current I(offsetdac) 363, 365 produced by DAC 362, 364 is adjusted to be equal to approximately I(amb)*Rf/R2i, where R2i is the input resistors to stage2 360. The gain of stage2 360 is determined by R2f/R2i and is adjusted to be approximately VFSadc/(Isig*Rf) where VFSadc=full scale ADC 330 input swing.

EXAMPLE

As an example, assume the following parameters: I(amb)=1 uA; I(sig)=100 nA; VFSstage1=1 v (limited by 1.8 v supply rails to get lower power); Rf1=1V/1 uA=1 Meg. R2i is chosen to have a value of approximately 100 Kohms.

Offset current I(offsetdac) produced by DAC 362, 364 is adjusted to be equal to approximately I(amb)*Rf/R2i; therefore, I(offsetdac) equals 1 uA*1 Meg/100K=10 uA.

Once the I(offsetdac) current is enabled, then R2f may be adjusted to be higher to produce a higher gain in stage2 360 that produces an output in ADC 330 that is approximately full scale. In this case, R2f us adjusted to equal approximately full scale/stage1 output=1V/1 uA=1 Meg.

Input referred current noise for stage2 is equal to Vnstage2/Rf1=Vnstage2/1e6, Vnstage2 is the voltage noise produced at the output of stage2 360.

Input referred current noise of ADC 220 is equal to Vnadc/(Rf1*G2)=Vnadc/(1e6*10), where G2=R2f/R2in=10 is the gain of stage2.

Input referred current noise for Offset DAC 362, 364 is equal to I(noffsetdac)/(R1f/R2in)=I(noffsetdac)/10.

Thus, by compensating for ambient noise to produce lower swings, a high ambient offset can be tolerated and low noise operation can be provided. The input referred ADC noise sees a large attenuation and the input referred offset DAC noise also sees gain of first stage.

Figure 4:
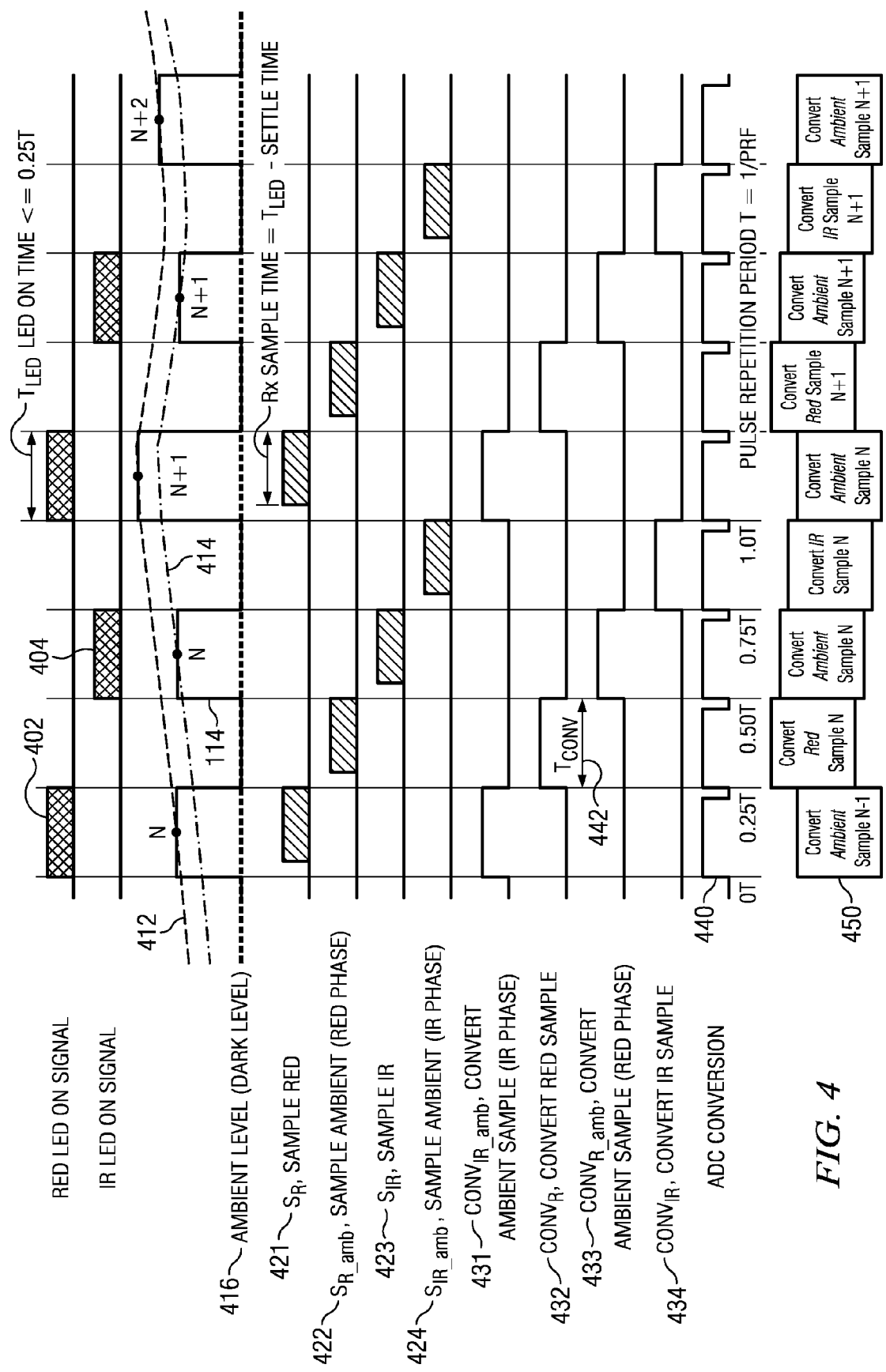
FIG. 4 illustrates waveforms at the input and output of the system that illustrates the pulses and the low frequency signal of interest.

FIG. 4 illustrates waveforms at the input and output of system 200 and 300 that illustrate pulses 402, 404 and low frequency signals of interest 412, 414.

In this embodiment, a pair of small light-emitting diodes (LEDs) is arranged to face a photodiode through a translucent part of the patient's body, usually a fingertip or an earlobe. One LED is red, with wavelength of 660 nm, and the other is infrared, 905, 910, or 940 nm. Absorption at these wavelengths differs significantly between oxyhemoglobin and its deoxygenated form; therefore, the oxy/deoxyhemoglobin ratio can be calculated from the ratio of the absorption of the red and infrared light. The monitored signal bounces in time with the heart beat because the arterial blood vessels expand and contract with each heartbeat. By examining only the varying part of the absorption spectrum (essentially, subtracting minimum absorption from peak absorption), a monitor can ignore other tissues or nail polish, and discern only the absorption caused by arterial blood. Plethysmograph signals 412, 414 represent the low frequency signals of interest that would be produced if the LEDs where on continuously. Since the LEDs are pulsed, these low frequency signals are carried by the pulses and are therefore not present when the LED is turned off. These signals may be sampled and be used to determine a subject's heart rate as well as amount of oxygen in blood using pulse oximetry as described above.

A single detector, such as detector 210 of FIG. 2 or FIG. 3, may be used to receive light pulses corresponding to red LED pulse 402 and infrared LED pulse 404. A current is produced by detector 210 that is proportional to received light. This current is then amplified and converted to a voltage by transconductance amplifier 220 or 350. During each of sample phases 421-424, the analog voltage output from TA 220 or from stage2 amplifier 360 is sampled. The sample phase width may be varied from 0 to 25% of duty cycle of each pulse repetition period (PRP) T. During sample phase 421, a voltage sample is obtained that corresponds to input current 214 during activation of the red LED. During sample phase 422, a voltage sample is obtained that corresponds to input current 214 while both LEDs or turned off, which therefore corresponds to ambient light effect. During sample phase 423, a voltage sample is obtained that corresponds to input current 214 during activation of the infrared LED. During sample phase 424, a voltage sample is obtained that corresponds to input current 214 while both LEDs or turned off. Sample phases 421-424 are indicated as S1, S2, S3, S4 in FIG. 1, as an example; however, individual switches as illustrated in FIG. 1 are not required. Various configurations of sample and hold logic in combination with an ADC are well known.

Ambient offset may be determined periodically during either or both ambient sample periods 422, 424 by turning off the compensation DACs and reducing the amplifier gain, as discussed above. In some embodiments, ambient offset may be determined periodically during an extended period of time during which the compensation DACs are turned off and the amplifier gain is reduced.

During each convert phase 431-434, each sampled analog voltage is converted 440 to a digital code 450. In these embodiments, ADC conversion time Tconv 442 is fixed at approximately 25% duty cycle of PRP T. However, in other embodiments, Tconv may have a different value according to capabilities of the ADC. Tconv may also have a different value for embodiments in which there is only one LED transmitter or more than two transmitters, for example.

Figure 5:
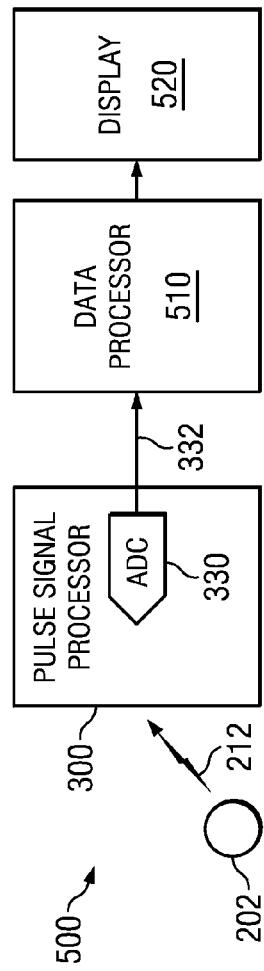
FIG. 5 is a flow diagram illustrating operation of a pulsed input signal system.

FIG. 5 illustrates a system 500 that includes pulsed input signal processor 300. ADC 330 provides a stream of digitized samples 332, as described in more detail above. In another embodiment, pulsed input signal processor 200 may be used in place of processor 300. The digitized samples may be used by data processor 510 to determine information provided by pulsed input signal 312. For example, processor 510 may determine pulse rate and hemoglobin saturation of a patient when pulsed input signal 312 passes through the patient by processing digitized samples 332. The resultant pulse rate and saturation ratio may be provided on display 520. Data processor 510 may be a central processing unit (CPU) coupled to a memory that holds software instructions, for example. Display 520 may be any type of known or later developed device for displaying human readable information, for example. Display 520 may be physically packaged together with data processor 510 and pulsed signal processor 300, or they may be in separate packages. For example, data processor 510 and display 520 may be part of a mobile device, such as a smart phone, a personal digital assistant, a tablet computer, a personal computer, etc.

Figure 6:
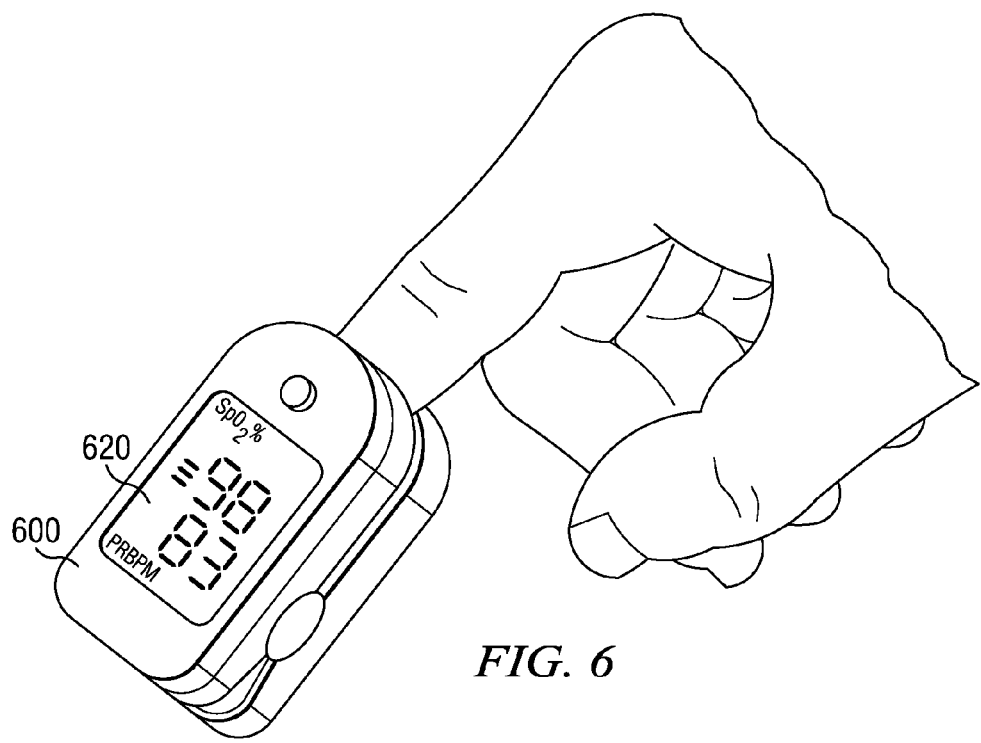
FIG. 6 illustrates a system that includes a pulsed input signal processor.

FIG. 6 illustrates a medical device 600 that includes a pulsed input system as described herein. In this example, device 600 is configured to clip over the end of a finger or earlobe. A pair of small light-emitting diodes (LEDs) is configured to face a photodiode through a translucent part of the patient's body, such as a fingertip or an earlobe. One LED is red, with wavelength of 660 nm, and the other is infrared, 905, 910, or 940 nm, for example. Absorption at these wavelengths differs significantly between oxyhemoglobin and its deoxygenated form; therefore, the oxy/deoxyhemoglobin ratio can be calculated from the ratio of the absorption of the red and infrared light.

The monitored signal bounces in time with the heart beat because the arterial blood vessels expand and contract with each heartbeat. By examining only the varying part of the absorption spectrum, a monitor can ignore other tissues or nail polish, and discern only the absorption caused by arterial blood. Thus, pulse rate may also be detected and used to subtract minimum absorption from peak absorption. Pulse rate and $O_2$ saturation percentage may be displayed on display 620.

Device 600 includes a pulsed input system similar to that described with regard to FIG. 2 or FIG. 3. As described in more detail above, embodiments of the invention included an ambient offset cancellation scheme that involves using an offset DAC to subtract an ambient offset at the front end prior to amplifying the input signal.

Figure 7:
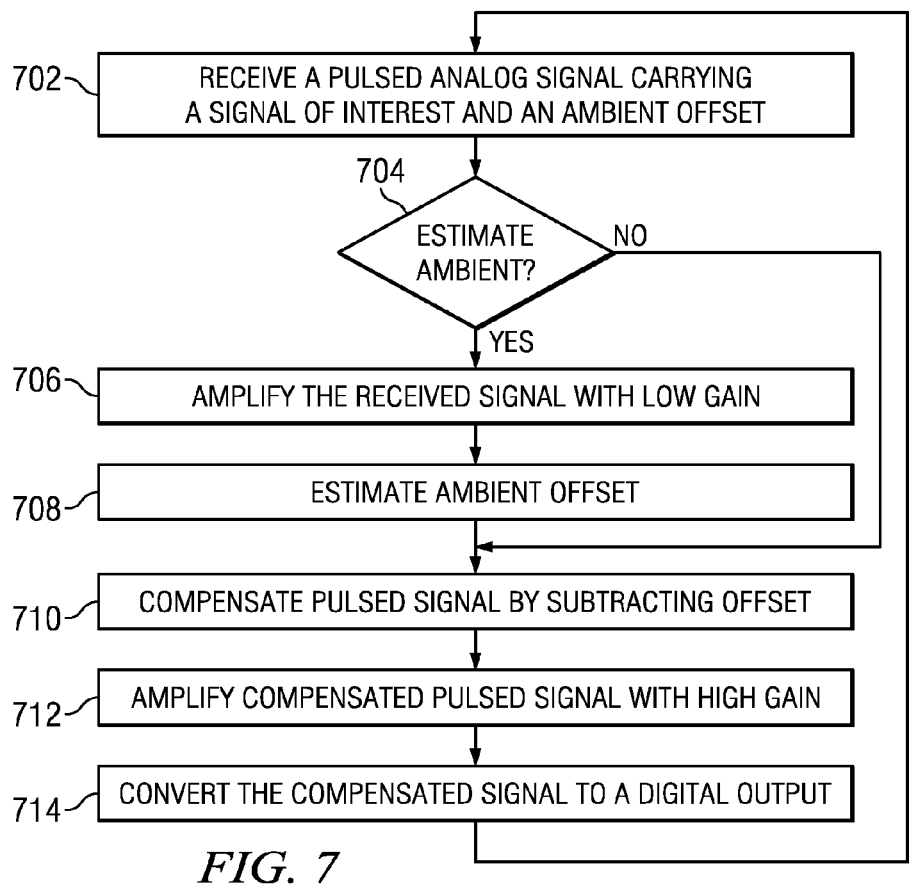
FIG. 7 illustrates a medical device that includes a pulsed input signal processor.

FIG. 7 is a flow diagram illustrating operation of a pulsed input signal system. A pulsed analog signal that carries a signal of interest along with an ambient offset is received 702. There may be one or more signals of interest carried on the pulses in a multiplexed manner. For example, the signal of interest may be plethysmograph signals derived from one or more light sources that may be indicative of a subject's heart rate as well as amount of oxygen in the subject's blood. The pulsed signal may be received by a photo detector, as described in more detail above.

The signal of interest may have a frequency that is lower than the pulse rate. For example, the signal of interest may have a frequency that is related to heart beat rate, which is nominally 60 beats per minute, while the pulsed signal may have a pulse recurrence frequency of 1 khz.

The received pulsed signal may be amplified 706 to form an amplified pulsed signal using an amplifier set to a low gain. In one embodiment, the received pulsed signal may be amplified by a transimpedance amplifier that converts a current signal into a voltage signal. The value of the gain is selected so that the input signal does not saturate the amplifier.

An amount of ambient offset in the amplified signal is estimated 708, as described in more detail above. The pulsed input signal is then compensated 710 by subtracting a compensation amount from the received pulsed signal according to the estimated amount of ambient offset.

The compensated pulsed signal is amplified 712 using an amplifier set to a higher gain value to form a compensated pulsed signal. By subtracting out a significant portion of the ambient offset value, the gain of the amplifier may be increased so that the signal of interest is amplified by a larger gain value. This large gain reduces input referred noise of an analog to digital converter in the front end while providing high dynamic range for signals with a large ambient offset.

The amplified pulsed signal is converted 714 at a rate that matches the pulse rate of the pulsed signal to form a digital output signal. In this manner, one sample is taken for each pulse. In another embodiment, two or more samples may be taken for each pulse. Each sample is taken over a period of time that has a defined duration time. In this embodiment, there is a set of sampling pulses 421-424 as illustrated in FIG. 4. The amplified signal is converted to a digital output signal using an analog to digital converter. In this embodiment, a continuous time sigma delta converter that has inherent anti-aliasing and also presents a resistive load is used to perform the analog to digital conversion. This reduces the power needed from the transimpedance amplifier.

Offset estimation may be performed periodically 704 in order to maintain a good estimate of ambient offset. Each time offset is estimated, the compensation is turned off and the gain of the amplifier is returned to the lower value. After completing offset estimation, the gain of the amplifier is returned to the higher value 712. The gain value of the amplifier may be adjusted each time an offset estimation is performed in order to optimize performance.

OTHER EMBODIMENTS

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed.

While a specific standalone medical device was described, other devices that comprise a detection device with a pulsed input system as described herein may be connected to a monitoring system that gathers information from several sensors and displays it on a single display. In another embodiment, a detection device may be connected to a mobile device, such as a cell phone, personal digital assistant, table computer, etc in order to display a representation of a signal captured and processed by the detection device.

Embodiments of the invention may also include a continuous time sigma delta ADC that reduces the drive requirements of the front end.

In some embodiments of the invention, the ambient estimation module may directly control the feedback resistors in order to vary the gain of the front end amplifier(s) while estimating ambient noise. In another embodiment, there may be an additional control function that controls amplifier gain and ambient estimation.

In another embodiment, a separate stage2 may be used to monitor ambient offset in parallel with a stage2 that performs signal of interest amplification and sampling. This eliminates the need to change the gain of stage2 to estimate ambient offset.

The ambient estimation and gain control techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Although specific terms are employed herein, they are used in a generic and descriptive sense only and not for purposes of limitation. Certain terms are used throughout the description and the claims to refer to particular system components. As one skilled in the art will appreciate, components in systems may be referred to by different names and/or may be combined in ways not shown herein without departing from the described functionality. This document does not intend to distinguish between components that differ in name but not function.

In the discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method of operating a pulsed input system, the method comprising:
    receiving a pulsed analog signal carrying a signal of interest and an ambient offset signal;
    amplifying the received pulsed signal using an amplifier set to a first gain value to form an amplified pulsed signal;
    estimating an amount of ambient offset in the amplified pulsed signal;
    compensating the pulsed signal by subtracting a compensation amount from the received pulsed signal according to the estimated amount of ambient offset;
    amplifying the compensated pulsed signal using an amplifier set to a second gain value to form an amplified compensated pulsed signal; and
    converting the amplified compensated pulsed signal to form a digital output signal using an analog to digital converter.

2. The method of claim 1, wherein the signal of interest has a frequency that is lower than the pulse rate.

3. The method of claim 1, wherein the amplifier set to a first gain value and the amplifier set to the second gain value are the same amplifier.

4. The method of claim 1, further comprising pre-amplifying the received pulsed analog signal prior to compensating the pulsed signal.

5. The method of claim 1, wherein estimating an amount of ambient offset is performed periodically.

6. The method of claim 5, wherein the second gain value is adjusted after each periodic estimation of ambient offset.

7. The method of claim 1, wherein converting the amplified signal is performed by a continuous time sigma delta converter.

8. The method of claim 1, wherein the pulsed analog signal carries two or more signals of interested multiplexed on respective pulses.

9. A system comprising a pulsed input signal detector, where the pulsed input signal detector comprises:
    a receiver configured to receive a pulsed analog signal carrying a signal of interest and an ambient offset signal;
    an adjustable gain amplifier coupled to an output of the receiver;
    an ambient offset estimation module coupled to the amplifier configured to estimate an amount of ambient offset in the amplified pulsed signal;
    a compensation module coupled to an input of the receiver configured to compensate the pulsed signal by subtracting a compensation amount from the received pulsed signal according to the estimated amount of ambient offset; and
    wherein the amplifier is set to a lower gain while the amount of ambient offset is being estimated and set to a higher gain while the pulsed signal is compensated.

10. The system of claim 9, further comprising a preamplifier coupled between the receiver and the adjustable gain amplifier.

11. The system of claim 9, further comprising a transmitter device configured to produce the pulsed signal.

12. The system of claim 10, further comprising a display screen coupled to an output of the pulsed input signal detector configured to display results derived from the pulsed input signal detector.

13. A system comprising a pulsed input signal detector, where the pulsed input signal detector comprises:
    means for receiving a pulsed analog signal carrying a signal of interest and an ambient offset signal;
    means for amplifying the pulsed signal using an amplifier set to a first gain value to form an amplified pulsed signal;
    means for estimating an amount of ambient offset in the amplified pulsed signal;
    means for compensating the pulsed signal by subtracting a compensation amount from the received pulsed signal according to the estimated amount of ambient offset;
    means for amplifying the compensated pulsed signal using an amplifier set to a second gain value to form an amplified compensated pulsed signal; and
    means for converting the amplified compensated pulsed signal to form a digital output signal.

14. The system of claim 13, wherein estimating an amount of ambient offset is performed periodically.

15. The system of claim 5, further comprising means for adjusting the second gain value after each periodic estimation of ambient offset.

* * * * *